United States Patent [19]
Lawman et al.

[11] Patent Number: 5,673,198
[45] Date of Patent: Sep. 30, 1997

[54] CONCURRENT ELECTRONIC CIRCUIT DESIGN AND IMPLEMENTATION

[75] Inventors: Gary R. Lawman, San Jose; Robert W. Wells, Cupertino, both of Calif.

[73] Assignee: Xilinx, Inc., San Jose, Calif.

[21] Appl. No.: 625,480

[22] Filed: Mar. 29, 1996

[51] Int. Cl.$^6$ .................................................. G06F 17/50
[52] U.S. Cl. .................................... 364/489; 364/488
[58] Field of Search .................... 364/488, 489, 364/490, 491, 578

[56] References Cited

U.S. PATENT DOCUMENTS

| | | | |
|---|---|---|---|
| 4,656,603 | 4/1987 | Dunn | 364/900 |
| 4,965,741 | 10/1990 | Winchell et al. | 364/513 |
| 5,111,413 | 5/1992 | Lazansky et al. | 364/578 |
| 5,212,771 | 5/1993 | Gane et al. | 395/160 |
| 5,220,512 | 6/1993 | Watkins et al. | 364/489 |
| 5,224,055 | 6/1993 | Grundy et al. | 364/488 |
| 5,278,769 | 1/1994 | Bair et al. | 364/490 |
| 5,287,284 | 2/1994 | Sugino et al. | 364/468 |
| 5,359,523 | 10/1994 | Talbott et al. | 364/468 |
| 5,367,468 | 11/1994 | Fukasawa et al. | 364/490 |
| 5,371,845 | 12/1994 | Newell et al. | 395/155 |
| 5,436,637 | 7/1995 | Gayraud et al. | 345/116 |
| 5,493,508 | 2/1996 | Dangelo et al. | 364/489 |
| 5,526,517 | 6/1996 | Jones et al. | 395/600 |
| 5,541,849 | 7/1996 | Rostoker et al. | 364/489 |

OTHER PUBLICATIONS

"The Evolution of PLD, CPLD and FPGA Design Tools," *Electronic Engineering*, Oct. 1993, pp. 541–548. No Author Info.

Stephen M. Trimberger, "Field–Programmable Gate Array Technology", Kluwer Academic Publishers, pp. 53–68, 128–132, and 204–218. Copyright 1994.

*Primary Examiner*—Kevin J. Teska
*Assistant Examiner*—Leigh Marie Garbowski
*Attorney, Agent, or Firm*—Edel M. Young; Crosby, Heafey, Roach & May; Adam H. Tachner

[57] ABSTRACT

A system for providing real time design feedback to a user of a data processing system for designing an electronic circuit includes a display system, a graphical, textual or mixed user input process which displays user input on the display system for designing an electronic circuit, and an implementation process with which generates an implementation of the electronic circuit in for example a field programmable gate array. Feedback is provided by monitoring the user input process to detect a change in the design of the electronic circuit. Upon detection of a change, information about the change is forwarded to the implementation process. The implementation process is executed as a background process to the user input process, in response to the change to produce implementation data on an incremental basis. Information about the implementation data is displayed on the display system as feedback to the user during the design process. Analysis of the implementation data produces information indicating the speed of operation of the generated implementation, information indicating the size of the generated implementation, or information consisting of a particular type of integrated circuit device on which the implementation should be made. The system provides immediate implementation feedback allowing an interactive design entry process for computer software based integrated circuit design.

32 Claims, 6 Drawing Sheets

CONCURRENT ELECTRONIC CIRCUIT DESIGN AND IMPLEMENTATION

BACKGROUND OF THE INVENTION

1. Field of the Invention

The present invention relates to computer programs used in the design and implementation of integrated circuits, and more particularly to systems for providing real time implementation feedback for designers of electronic circuits using software design tools.

2. Description of Related Art

Computer software based design tools for implanting integrated circuits have become necessary in the design of most complex circuits. Such design tools are typically based on a high level textual or graphical programming language for describing the circuit to be implemented, including text based hardware description languages, and schematic entry systems based on graphic user interfaces with which a user actually makes a drawing of a logic circuit being implemented. The high level hardware description language or graphic representation of the logic circuit, is then translated into a lower level list of components, often referred to as a net list, used in the implementation of the circuit. The net list is then processed so that actual implementation of the logic circuit represented by the net list can be generated for a target device, such as a field programmable gate array (FPGA), a logic cell array (LCA), an EPROM-based programmable logic device (EPLD), a complex programmable logic device (CPLD), an application specific integrated circuit (ASIC), or a custom integrated circuit. After an implementation has been developed, simulation of the operation of the circuit can be executed to verify its function, timing and suitability for the design. See Trimberger, FIELD-PROGRAMMABLE GATE ARRAY TECHNOLOGY, Kluwer Academic Publishers, pp. 53–68, 128–132, 204–218, 1994. After a design has been implemented for the target device, the operation can again be simulated to verify timing.

While this design process based on high level textual or graphical description languages has been widely successful, the processes to date have been executed in sequence. Thus, in a design realization phase, a designer will create, using a design entry program, a description of the logic circuit to be designed. The realization phase may take days or weeks to complete. Next, during an implementation phase the complete description is provided to an implementation process which produces a specification of an actual physical implementation of the circuit. This specification can then be utilized to run simulations of the circuit that has been designed. Data is generated about speed of operation of the design, size of the chip, and whether the design in progress fits on a particular target chip. Because of the sequential nature of the processes, hours, days or weeks could pass between the time that a designer actually creates the description, and feedback about the actual operation of the design as it relates to physical implementation on a chip is provided to that designer. Although design entry programs may include logical design rule checking (DRC) which helps to prevent creation of illegal logical constructs within the design in progress, the designer must complete the realization phase (also called design capture phase) before starting the implementation process to generate data about the implementation. It may happen that the implementation phase results in feedback that requires the designer to discard substantially all of the first realization, and start again with a completely new design approach, requiring a second realization phase lasting days or weeks.

This long cycle from design to implementation to simulation is undesirable, particularly in markets where programmable logic devices are used to implement logic circuits. In this field, a designer creates a logic design which is to be implemented in the programmable logic device. The design is implemented according to the design process of the particular programmable logic device. After it is implemented, then the timing simulation of the circuit can be run. These markets however typically have a very short lead time. Thus, the amount of time between design of the logic circuit and feedback concerning the design can become a critical factor in time to market.

Accordingly, a more effective design process for use in implementing electronic designs on integrated circuits, and particularly in programmable logic devices is desirable.

SUMMARY OF THE INVENTION

The present invention provides a technique for providing real time design implementation feedback to a designer of an electronic circuit using automated design technology. In this context, "real time" means that implementation feedback useful during the design capture phase for a device is produced during design entry by concurrent incremental execution of an automated implementation process that produces actual implementation data, or by other data processing techniques which provide information about implementation of the design being created. Implementation data provided by implementation processes includes data about the actual physical realization of the design in progress. For example, for FPGAs, implementation data includes information about actual performance of the circuit as determined by timing calculations for physically realized routes and mappings, and actual area occupied after placement on a target device. During the design capture phase, the designer is given implementation feedback including, for example, information about whether the design in progress fits on a particular target device, information about the speed of the implementation, and information about power consumption of the implementation.

Data processing systems used for designing electronic circuits can be characterized as including a display system, a user input process which displays user input on the display system for designing an electronic circuit, and an implementation process which generates an implementation of the electronic circuit. According to the present invention, the process for providing feedback includes monitoring the user input process to detect a change in the design of the electronic circuit. Upon detection of a change, information about the change is forwarded to the implementation process. The implementation process is executed concurrently with the user input process in response to each change to produce implementation data on an incremental basis. Information about the implementation data is displayed on the display system as feedback to the user during the design process.

The user input process may include a graphical user interface in which a graphic representation of the change in design of the electronic circuit is displayed. In one preferred embodiment of the invention, the implementation data are displayed while the graphic representation of the change in design of the electronic circuit is being updated.

Alternatively, the user input process includes a text input interface in which a description language representation of the change in the design of the electronic circuit is displayed. Again, in a preferred embodiment according to this aspect, in order to provide most effective feedback to the user creating the design, the implementation data is displayed while the description language representation of the change in design of the electronic circuit is being displayed. In an alternative embodiment both graphical and textual displays are provided.

According to another aspect of the present invention, user input is accumulated which represents incremental changes in the electronic design. This user input is packaged into a change message which includes one or more incremental changes. The change message is forwarded to the implementation process. The number of times that the implementation process is executed during the design process can be controlled by controlling the number and content of the change messages. For example, the change messages may be created by analyzing the user input to identify sets of one or more incremental changes which meet a predefined metric for the change messages. Analysis of the user input may use fuzzy logic or an expert system. Also, as a user inputs a pre-determined block of logic, pre-calculated feedback may be provided immediately without a need for execution of an implementation process.

According to yet another aspect of the invention, the implementation data is analyzed to produce feedback messages (text or graphics) which are displayed. The analysis of the implementation data produces feedback to be displayed, for example, information indicating the speed of operation of the implementation, information indicating the size of the implementation, or information consisting of a particular type of integrated circuit device on which the implementation could be made. For analog implementations, feedback about parameters like the RC time constant of a circuit element can be produced.

Furthermore, the feedback messages, according to one embodiment, include information about alternative components to be utilized, or alternative logic blocks which could be utilized for a particular component or logic block inserted into the design by the user. These alternatives, according to a particular implementation of the invention, may be selected from a design library maintained for use with the implementation process (or processes), or may be generated using alternative implementation techniques such as supplied by expert system programs.

According to yet another aspect of the invention, the user input process and the implementation process may be executed on independent data processors which are connected by a communication link, such as a local area network, a high speed bus, or a wide area network link. An interprocess communication function is executed between the user input process and the implementation process, or processes, in order to transfer the change messages and the feedback messages between, or among, the processes.

The present invention is particularly important for implementation in programmable logic devices, and most particularly field programmable logic arrays. According to this aspect of the invention, the implementation process comprises partition, place, and route functions for the field programmable logic arrays. Feedback according to the present invention includes information about maximum delays, information about maximum frequencies of operation, information about resource utilization in the logic device (FPGA, LCA, EPLD, CPLD, ASIC, custom design, etc.), such as number of pins used or remaining, capacity remaining, capacity consumed, clocks used, design hints, heat generated, power needed, and the like. Furthermore, in one embodiment the feedback process provides information about a particular programmable logic device selected out of a family of programmable logic devices, as a recommendation for an implementation target device to the designer.

Accordingly, the present invention provides a system for immediate implementation feedback during the design entry process for computer software based integrated circuit design. Using immediate feedback, the user is capable of identifying critical paths in the design in real design time (as the design is being entered). In addition to identification of critical paths in real design time, feedback concerning improvements or alternatives that can be used in the critical paths, can be provided in real time. With real time feedback provided throughout the design capture process, the designer is provided constant reassurance of the viability of the design through an interactive process. Further, the designer knows at the earliest possible time whether a particular design element will cause an implementation problem.

While the description relates most closely to digital logic devices, the invention can be used for analog devices as well. Other aspects and advantages of the present invention can be seen upon review of the figures, detailed description, and claims which follow.

DETAILED DESCRIPTION

Figure 1:
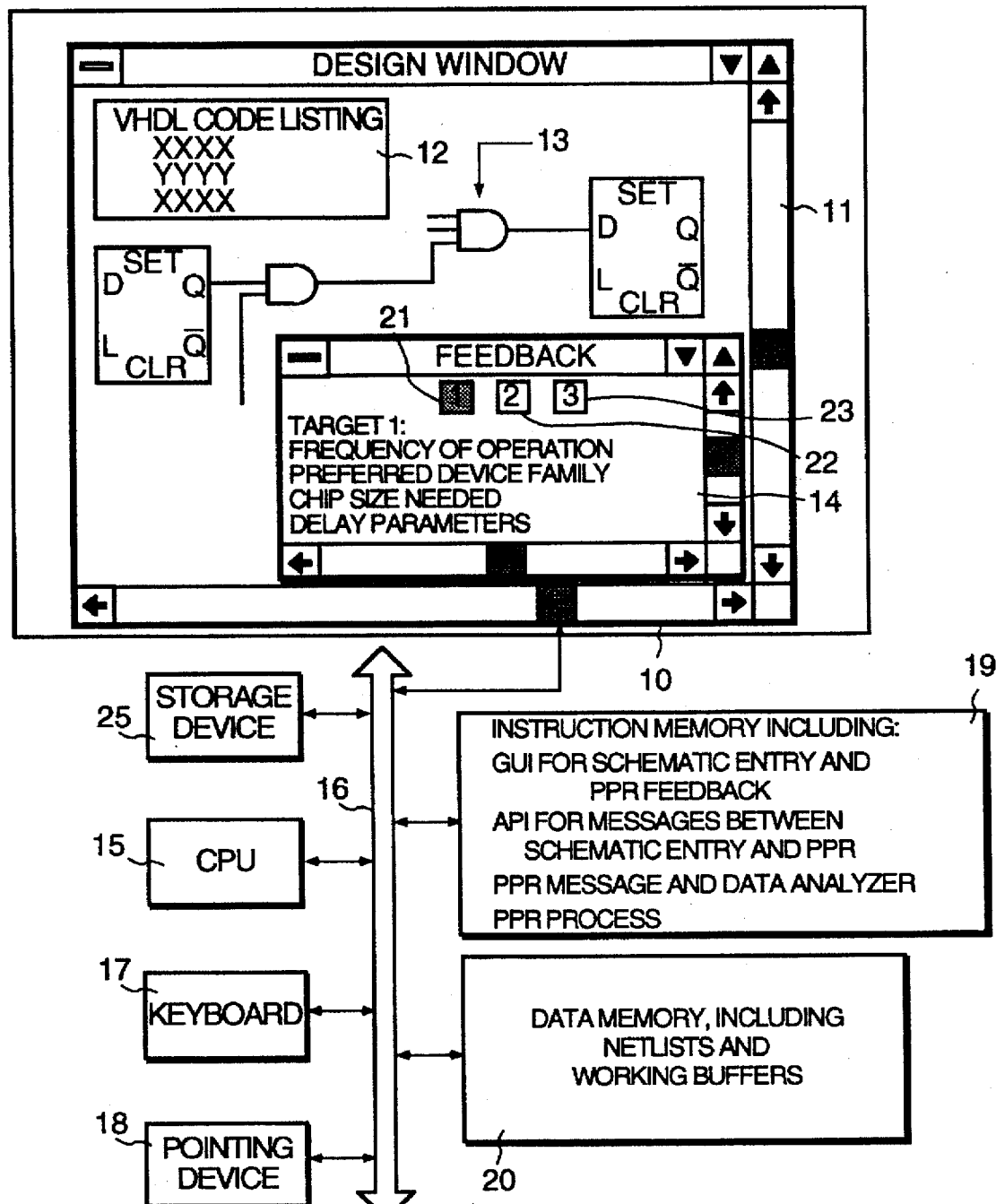
FIG. 1 is a simplified diagram of a data processing system which executes the process for providing real time implementation feedback to a designer of an electronic circuit.

A detailed description of representative systems implementing the present invention is provided below with reference to FIGS. 1–7. FIG. 1 illustrates the basic data processing system according to the present invention. In the data processing system of FIG. 1, a display 10 including a design window 11 is provided. The design window 11 shown in FIG. 1 includes two types of user input processes. A first user input process is a text process with which a user writes a hardware description language (HDL) description of an electronic circuit being designed into a text window 12 within the design window 11. A second illustrated user input process includes a schematic entry system by which a user generates a schematic or logic diagram, generally 13, of an electronic circuit being designed. According to one embodiment of the present invention, an implementation feedback window 14 is included on the display 10. This feedback window 14 is updated while the user executes a user input process, or processes to create or modify a design. (The design window 11 and text window 12 are also updated in response to user input.) The feedback window preferably responds to algorithms used in different contexts, e.g. data path design context and random logic design context.

In another embodiment, or as a feature of the above embodiment, the same feedback information can be inserted directly into the design entry window 11. For example, to indicate a critical path between circuit elements in the design entry window 11, an annotation indicating the actual timing can be attached to the path between the two flip flops in the design entry window 11.

The display is connected to a host central processing unit (CPU) 15 across bus 16. The CPU 15 is coupled to a keyboard 17, a pointing device 18, large scale storage 25 and possibly other peripheral components not shown in the figure across the bus 16. Also coupled to the bus 16 are an instruction memory 19 and a data memory 20. According to the present invention, the instruction memory 19 stores computer programs, including, (1) a graphic user interface (GUI) for text and schematic entry and for the partition, place and route (PPR) feedback process, (2) an application program interface (API) for messages between the GUI process and the PPR process, (3) a PPR message and data analyzer, and (4) a partition, place and route process. The PPR process is used when the electronic circuit is being implemented on a programmable logic device in which the implementation process comprises partition, place and route functions as known in the art. Other implementation processes are utilized for other types of target integrated circuits.

The data memory 20 includes working buffers and memory for net lists and the like which are used in the implementation and design processes.

Accordingly, the user of the system shown in FIG. 1 executes a user input process to create or modify a logic circuit on the design window 11. As the logic circuit is being designed using the graphic user interface, the API process generates messages about changes in the design for sending to the partition, place and route process. The partition, place and route process then is executed in response to the message about the change as a concurrent background operation. Data about changes in the implementation are then processed by the PPR message and data analyzer. Feedback messages are produced and sent back to the graphic user interface for display in a feedback window 14 within the design window 11.

The text window 12 in FIG. 1 is provided in order to emphasize the user input process may be a text based process in which a high level description language such as VHDL is utilized to design the circuit. Thus the text window 12 displays, for example, a VHDL listing for a design element or elements, such as the following:

```
be := (others => '1');
case i is
    when 0 | 1 | 2 | 3 =>
        be(i mod 4) := '0';
        SetSignal(Dev 1, SET_DATA, 16#ffffff#);
    when 4 =>
        be(3) := '0'; be(0) := '0';
        SetSignal(Dev 2, SET_DATA, 16#33333333#);
    when 5 =>
        be(2) := '0'; be(1) := '0';
        SetSignal(Dev 3, SET_DATA, 16#55555555#);
    when others => NULL;
end case;
```

Of course user input may also be schematic entry or mixed text and schematic entry. With design capture using a high level description language, a net list synthesis process is run to produce a net list upon which implementation feedback is based. The feedback window 14 in the illustrated example includes buttons 21, 22 and 23 which correspond to the respective target devices or target implementation processes for a given target device. By selecting a target button, such as button 21, feedback about the corresponding target is displayed.

Figure 2:
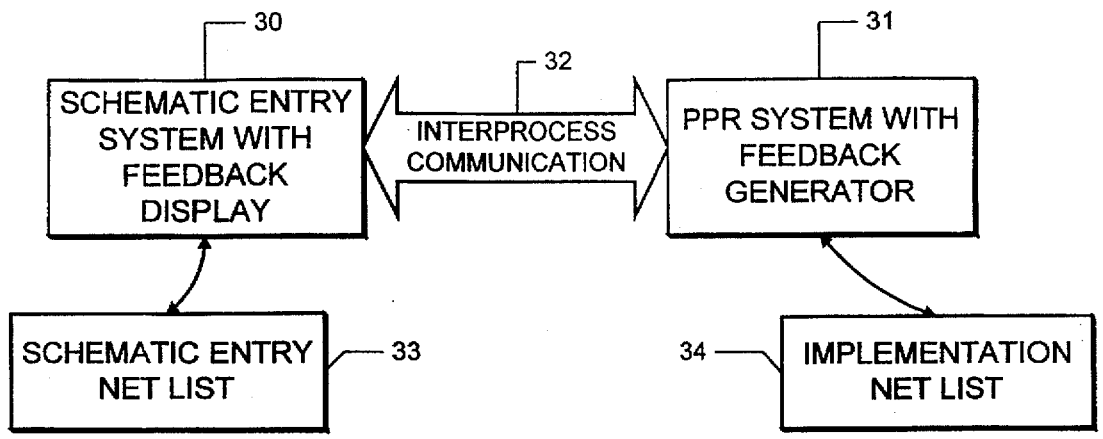
FIG. 2 is a simplified block diagram of basic components of the present invention according to one embodiment.

FIG. 2 illustrates functional components of the present invention according to one implementation. As can be seen, the system includes a schematic entry system 30 with a feedback display, such as shown in FIG. 1. A partition, place and route system 31, or other implementation system, is also included along with a feedback generator. An interprocess communication function 32 connects the schematic entry system 30 with the PPR system 31. The schematic entry system 30 builds a schematic entry net list 33 according to this embodiment. Thus, as a user places components on the screen using the graphical user interface, corresponding elements of a net list are added to the schematic entry net list 33. Changes in the schematic entry net list 33 are then communicated across the interprocess communication link 32 to the PPR system 31. The PPR system 31 then updates the implementation net list 34 with the changes, executes the implementation process, and generates feedback. The feedback is communicated across the interprocess communication function 32 to the display associated with the schematic entry system 30.

The interprocess communication link 32 may take the form of an application program interface (API) style program. As changes are made using the schematic entry system, these changes are translated into API messages. The API messages are sent to the PPR system, where they are translated into data utilized for the implementation net list 34. Similarly, feedback is packaged as an API message which is sent to the schematic entry system 30, where the API message is translated into the format utilized by the graphic user interface for feedback display.

The API process communicates with data analyzers in both design entry and implementation modules according to one embodiment. Thus, a data analyzer is included with the schematic entry system which monitors the changes being made in the design and applies a metric to the changes in order to create change messages. When the changes have accumulated to the point that according to the metric they constitute an incremental change sufficient for an execution of the partition, place and route system, then the change message is forwarded across the interprocess communication link 32. This accumulation of user input can be a simple process in which change messages are sent, (1) when a pre-specified number of components are added using the schematic entry system, (2) when each new component is added, or (3) when a certain classification of groups of components are added. As mentioned earlier, the decision about when design changes are acted upon may be determined using artificial intelligence, neural networks, context sensitive algorithms, or simply using the magnitude of a change. Alternative systems rely on user input to signal the data analyzer to send a change message.

In a similar manner, analysis is executed by the PPR system 31. Thus, as changes in the implementation are created, the data relevant to the changes is analyzed to determine whether it is suitable for feedback, or whether it should trigger other processing needed to produce feedback for the user. Thus for example, when a change in the schematic affects the critical timing path of the circuit, then information about the critical path can be provided. When the change causes the implementation being realized to cross a threshold in the device size, in semiconductor area or in pin count needed, or in the speed of operation of such resources, then an analysis of those changes can be made to recommend alternative designs, or alternative devices on which to implement the electronic circuit being designed.

Figure 3:
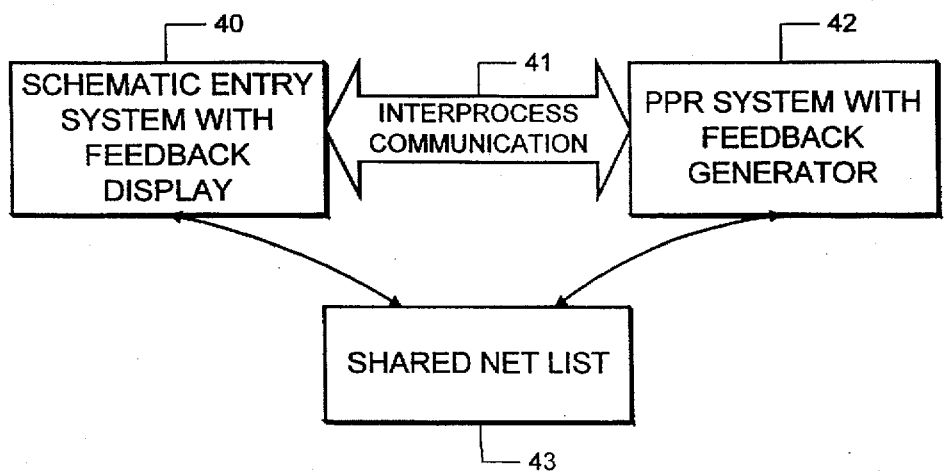
FIG. 3 is a simplified diagram of functional components of the present invention according to an alternative embodiment.

FIG. 3 illustrates an alternative implementation of the present invention. According to FIG. 3, a schematic entry system 40 with feedback display is coupled through an interprocess communication link 41 to a partition, place and route system 42. The schematic entry system includes the feedback display, and the partition, place and route system 42 includes the feedback generator such as discussed above with respect to FIG. 2. In the embodiment of FIG. 3, a shared net list 43 is provided. Thus, changes made using a schematic entry system are translated into a format utilized by shared net list 43. The changes are then added to the shared net list. When a change is made, an indication that the change has occurred is sent across the interprocess communication link 41. In response to the indication, the PPR system reads the change in the shared net list, and executes the implementation process. Upon execution, the feedback generator produces a feedback message which is transmitted across the interprocess communication link 41 for display with the schematic entry system 40.

Figure 4:
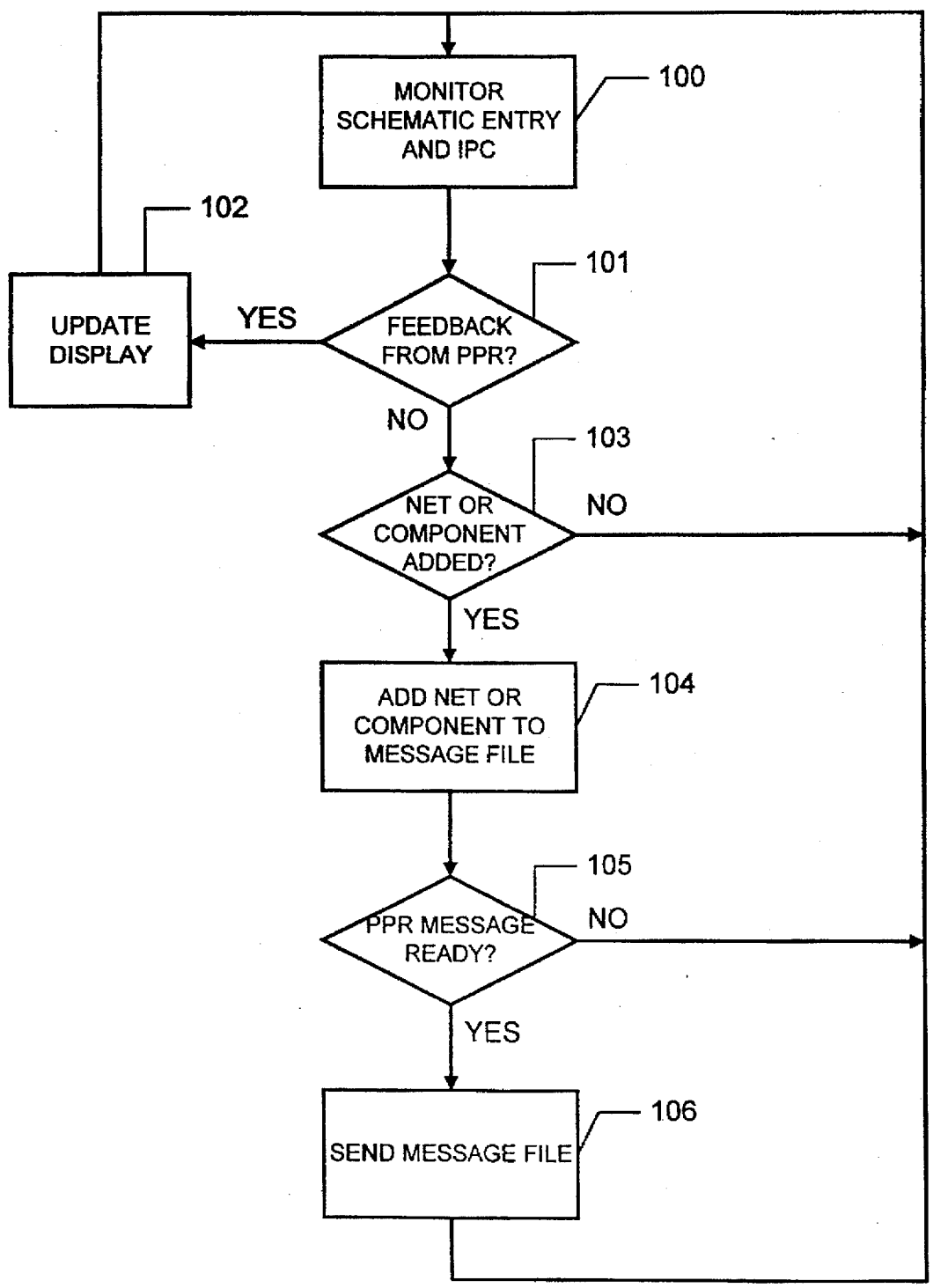
FIG. 4 is a flow chart illustrating a process for monitoring the user input process according to the present invention.
Figure 5:
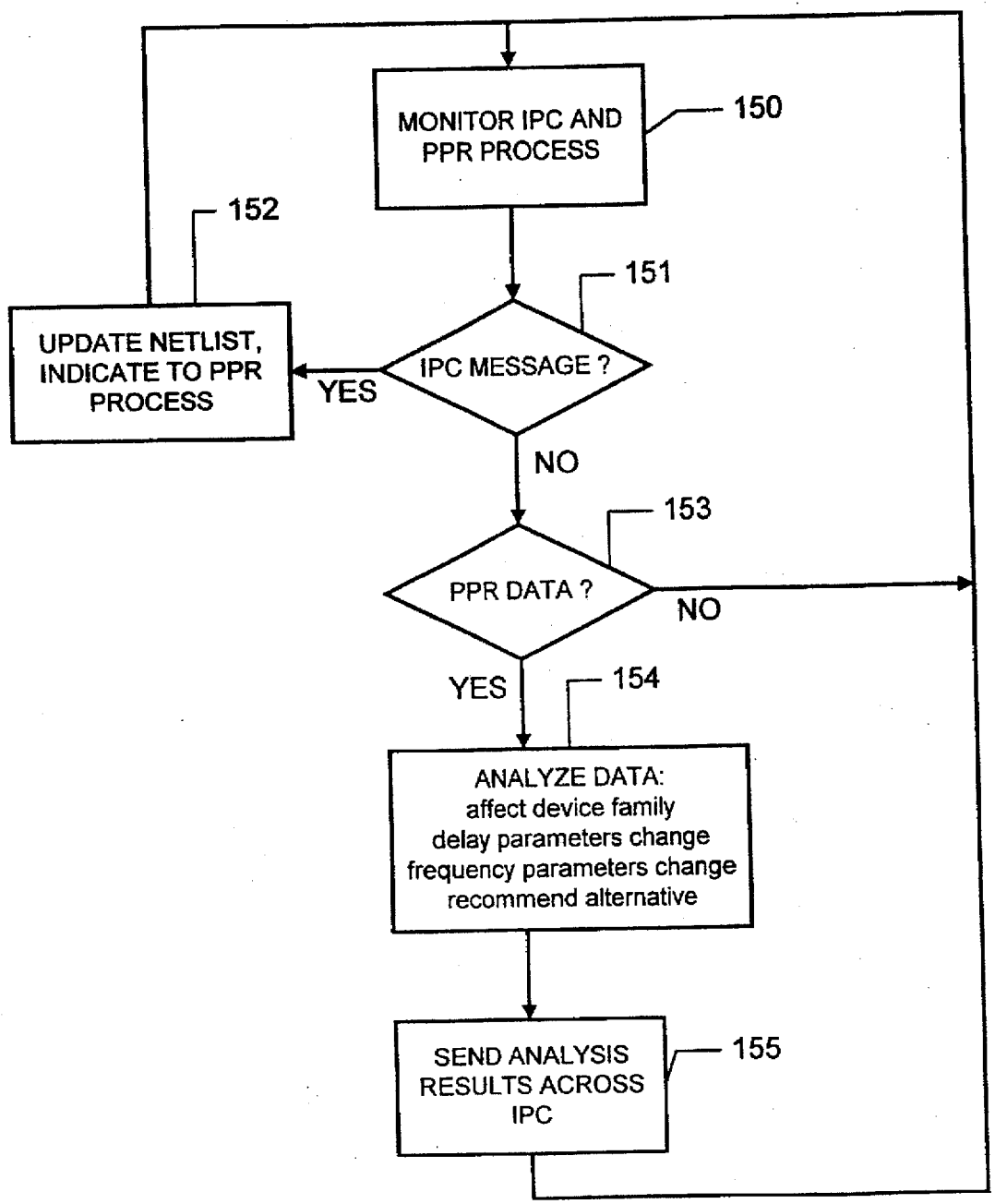
FIG. 5 is a flow chart illustrating a process for interfacing with the implementation engine and generating feedback according to the present invention.

FIGS. 4 and 5 illustrate approaches to the analysis executed on either side of the interprocess communication link 32 or 41 of FIG. 2 or 3. The process associated with the schematic entry system is shown in FIG. 4. According to the preferred embodiment of the present invention, a commercially available schematic entry system is supplemented with the process shown in FIG. 4 which monitors the schematic entry system, and the interprocess communication link IPC (block 100). During the monitoring, when feedback is detected from the partition, place and route software as indicated by block 101, the display that the user is reviewing during the schematic entry process is updated (block 102). In one system a plurality of technologies with corresponding partition, place and route software modules are evaluated in parallel, each with the ability to send feedback to update the display.

If at block 101, the data being processed is not feedback, then it is determined whether a net or other component has been added to the circuit being designed (block 103). If not, then the algorithm loops to continue monitoring the schematic entry system and the interprocess communication link at block 100. If a new net or component has been added at block 103, then the net or component is added to a message file (block 104). This message file is analyzed to determine whether a message to the partition, place and route engine is ready according to a change message metric (block 105). If not, then the algorithm loops to continue monitoring the schematic entry process at block 100. If the message is ready, then the message file is sent across the IPC to the partition, place and route software (block 106).

The process at block 105 of determining whether a partition, place and route message is ready involves in a preferred embodiment applying a metric to the contents of the message file which represents incremental changes in the electronic design. For example, if a prespecified number of changes, such as five changes, have been made, then the message is sent. Alternatively, a message may be sent for every change made in a schematic diagram. Another metric that might be applied would involve sending the change message only when a new storage element is added to the design. A wide variety of metrics could be applied depending on the particular type of implementation being created, and the type of circuit being designed. Also a user controlled process can be used to define the change messages on an ad hoc basis.

The process associated with a partition, place and route engine is illustrated in FIG. 5. According to a preferred embodiment, commercially available partition, place and route software is utilized, supplemented with an interface such as shown in FIG. 5. This process monitors the interprocess communication link and the partition, place and route process, as illustrated at block 150. If data are detected during the monitoring, which is an IPC message as indicated at block 151, then the net list utilized by the partition, place and route process is updated, and the partition, place and route process is notified of the update (block 152). In response to the notification, the partition, place and route process executes an incremental implementation process utilizing the change. The incremental implementation process in one embodiment of the invention includes, for pre-characterized design changes, a single look-up into a database of feedback for a set of pre-characterized design changes or elements.

If the data detected at the monitoring step 150 is not an IPC message, then the process determines whether the data constitutes implementation data from the partition, place and route process (block 153). If it is not implementation data, then the algorithm continues to monitor as indicated at block 150. If implementation data are received, then the process analyses the data (block 154). The data are analyzed to determine, (1) whether the changes would affect the recommended device family on which to implement the circuit, (2) whether delay parameters associated with the circuit are changing, (3) whether frequency parameters are changing, and (4) whether alternative designs might be recommended for a particular logic block subject to the change.

After analysis of the data, results of the analysis are sent across the IPC to the display as feedback to the user (block 155), and the algorithm loops back to continue monitoring the interprocess communication link and the partition, place and route process at block 150.

Figure 6:
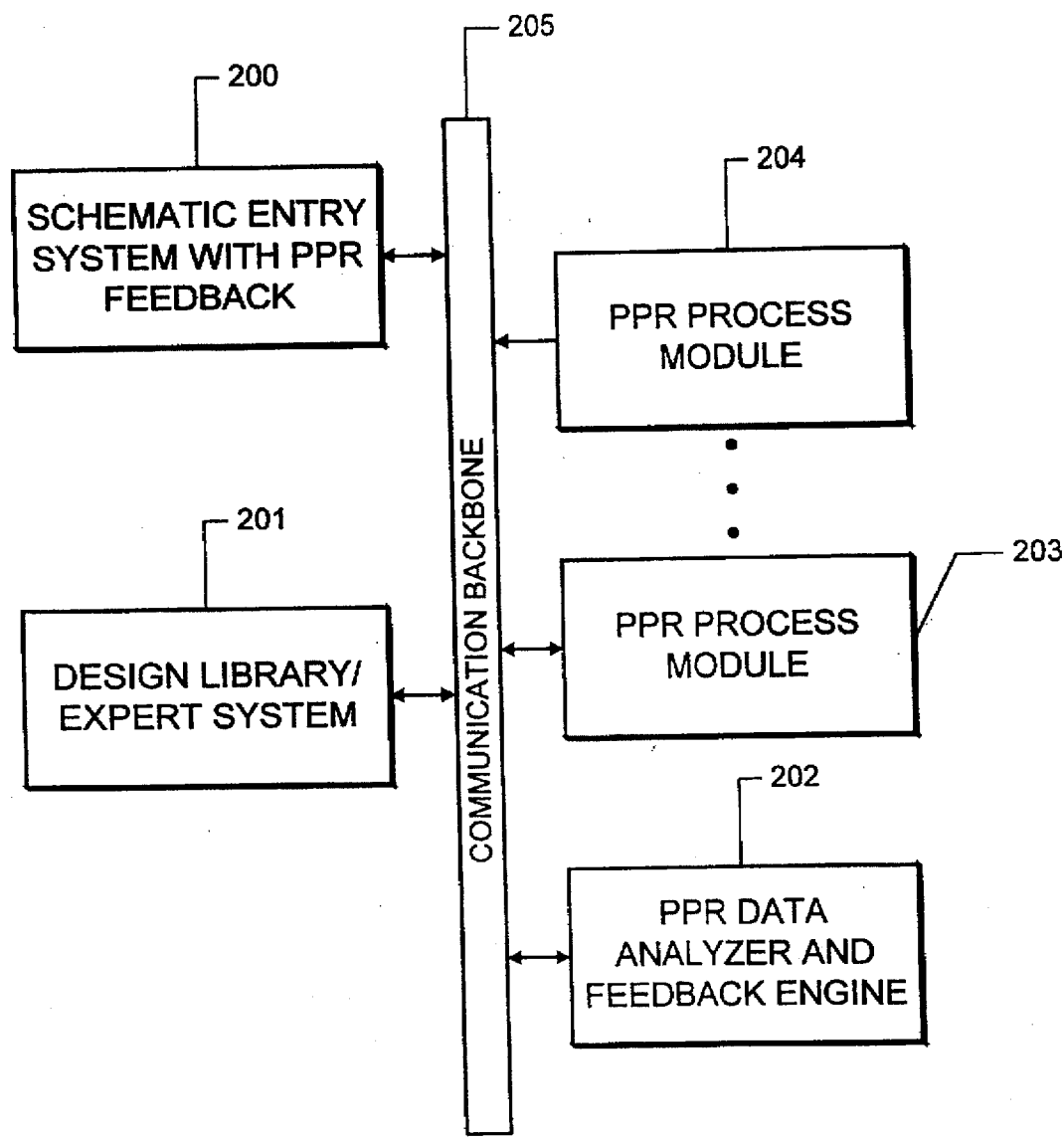
FIG. 6 is a schematic diagram of a data processing system implementing the present invention in a distributed processing environment.

FIG. 6 is a schematic illustration of a data processing system implementing the present invention in a distributed processing mode. Thus, FIG. 6 includes a module 200 which provides a schematic entry system with partition, place and route feedback, a module 201 which provides a design library and an expert system for utilization during a design, a module 202 which provides a partition, place and route data analyzer and feedback engine, and modules 203 and 204 which provide partition, place and route process modules. The modules 203 and 204 are used according to a particular user's needs, such as for concurrent execution in connection with the active design entry process, for application to different types of devices, or for sequential implementation steps. The modules 200 to 204 may be independent processing modules on a single board, modules on separate cards in a single box, or distributed in a network.

The modules 200–204 communicate across a communication backbone 205. The communication backbone 205 may take the form of a high speed bus, a local area network, or even a wide area network link, such as an Internet protocol cloud or the like. The schematic entry system in module 200 executes the process described with reference to FIG. 4. Messages are sent to the module 202 which processes the message files, and routes them to a process module 203 or 204 for execution. Results of the implementation processes in modules 203 or 204 are returned to the module 202 for producing feedback messages. The data is analyzed, and if appropriate the expert system and design library in module 201 are referenced for the purposes of creating feedback messages. Feedback messages are compiled in the module 202 and sent to the schematic entry system 200 for display to the user.

Figure 7:
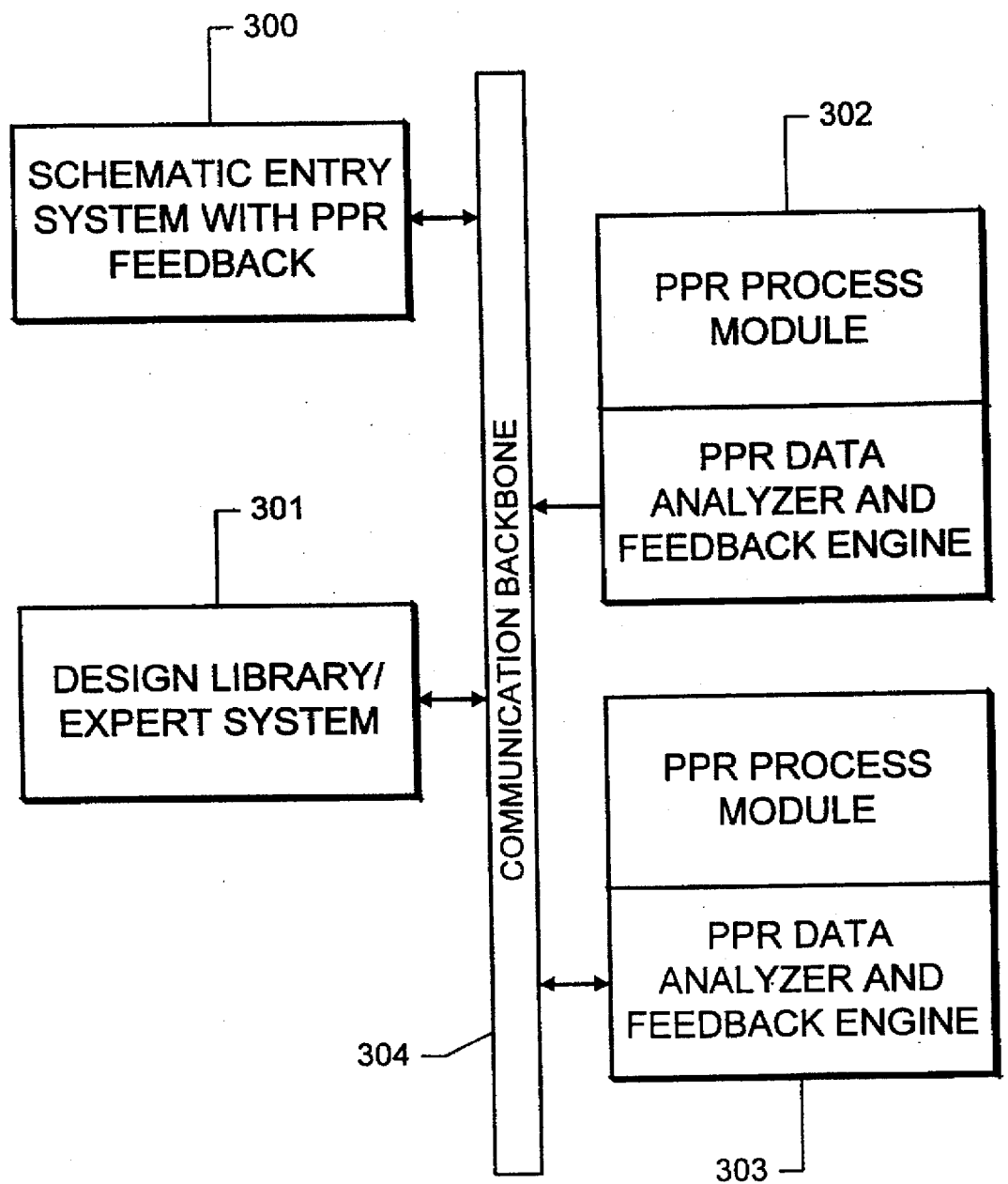
FIG. 7 is a block diagram of an alternative distributed architecture for a data processing system implementing the present invention.

A distributed system like that shown in FIG. 6 may distribute the processes in a different manner. For example, the data analyzer and feedback processes may be distributed to the independent partition, place and route modules as shown in FIG. 7. Thus, a system according to the architecture of FIG. 7 includes a module 300 which provides a schematic entry system with partition, place and route feedback, a module 301 which provides a design library and an expert system for utilization during a design, a module 302 which provides a partition, place and route data analyzer and feedback engine in combination with a partition, place and route process engine, and one or more additional modules like module 303 which provides another partition, place and route data analyzer and feedback engine in combination with another partition, place and route process engine. The modules 300, 301, 302, 303 communicate according to the protocol selected for the system across a backbone 304.

Also, the expert system and design library may be used by the other modules in a variety of ways. For example, the design library may store a set of standard logic blocks along with implementation data relative to the stored standards. If the implementation engine recognizes a logic function for which a standard block exists, then notification of the design alternative can be provided to the user in the feedback message. Similarly, the expert system may provide information about particular device family in which to implement a given design. If the implementation process crosses a threshold in terms of the number of gates required or the levels of logic in a critical path, then the expert system can recommend alternative devices in which to implement the process.

The implementation and feedback processing can be executed as a background (concurrent) process while a user is designing an electronic circuit. A user designing an electronic circuit at a workstation may take from several hours to weeks to complete the process. However, the amount of actual processing involved in responding to the design input can be relatively low. Of course if the designer enters a CPU block or other major design component, the processing may be considerable. Even so, the feedback to the designer arrives quickly so the designer can reconsider adding the new design element if the overall effect is negative, and can do this before adding other design elements that depend on the newly added element. As a background process, and during the design effort, the implementation processes, implementation data analysis, and feedback are generated while the designer is easily able to respond to the feedback. The process is interactive. Thus, as a logic block is being designed and is being displayed on the screen, feedback relative to that logic block can be generated and supplied to the user. This real time feedback can be supplemented by processes which refine the feedback by continuing to explore implementation alternatives while a designer sleeps.

As mentioned above, the present invention is particularly adapted to interactive design of logic circuits for implementation on the field programmable gate array devices. Design and implementation of such products are often in the critical path for time to market of a product utilizing the circuit. Accordingly, rapid feedback in the design process can be critical to success of a product.

Although the present invention is particularly suited to field programmable gate array implementations, it is equally useful in connection with other programmable logic devices, with gate array technology, with application specific integrated circuits and even with full-custom design. Furthermore, the present invention applies as well to the design of analog machines and all kinds of machines which are subject of computer software design tools.

The foregoing description of some preferred embodiments of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. In a data processor including a display system, a user input process which displays user input on the display system for designing an electronic circuit, and an implementation process which generates an implementation of the electronic circuit on a selected programmable logic device by performing a partition, place and route function, a method for providing design feedback to a user of the system, comprising:

monitoring the user input process to detect a change in design of the electronic circuit;

producing, concurrently with the user input process, implementation data for the change;

analyzing the implementation data to produce a feedback message; and displaying information about the implementation data on the display system as said feedback message while the user is designing the electronic circuit;

wherein the feedback message includes information indicating a particular plurality of programmable logic devices is suitable for the electronic circuit being designed and information indicating a performance characteristic of the generated implementation, said feedback message indicating either of the selected programmable logic device and the performance characteristic to be changed by the user.

2. The method of claim 1, wherein the user input process includes a graphical user interface in which a graphic representation of the change in design of the electronic circuit is displayed, and the step of displaying includes displaying the information about the implementation data while the graphic representation of the change in design is being displayed.

3. The method of claim 1 wherein the user input process includes a text input interface in which a description language representation of the change in design of the electronic circuit is displayed, and the step of displaying includes displaying the information about the implementation data while the description language representation of the change in design is being displayed.

4. The method of claim 1, wherein the user input process generates a list of logical elements in the electronic design, and the step of producing implementation data includes sending changes in the list of logical elements to the implementation process, and executing the implementation process.

5. The method of claim 1, including accumulating the user input representing incremental changes to produce a change message including one or more incremental changes, and wherein the step of producing implementation data includes sending the change message to the implementation process, and executing the implementation process.

6. The method of claim 5, including analyzing the user input to identify sets of one or more incremental changes meeting a metric for change messages.

7. The method of claim 5, including sending the change messages in response to user input.

8. The method of claim 5, wherein the data processing system includes a first processor executing the user input process, a second processor executing the implementation process, and a communication link between the first and second processors, and wherein the step of sending includes transmitting the information about the change from the first processor to the second processor across the backbone communication link.

9. The method of claim 8, wherein the data processing system includes a third processor executing a second implementation process, and the method includes executing the implementation process on the second processor and implementation process on the third processor concurrently.

10. The method of claim 1, wherein the step of producing implementation data includes retrieving data concerning implementation of the change from a database.

11. The method of claim 1, wherein said performance characteristic comprises the speed of operation of the generated implementation.

12. The method of claim 1, wherein said performance characteristic comprises the size of the generated implementation.

13. The method of claim 1, wherein said performance characteristic comprises the power consumption of the generated implementation.

14. The method of claim 10 wherein said data concerning implementation of the change comprises a design alternative.

15. The method of claim 1, including displaying icons representing respective target devices on the display, and responding to selection of a particular icon by providing feedback about the respective target device.

16. The method of claim 1, wherein said information about the implementation data is displayed in the same window as said user input is entered.

17. The method of claim 1, wherein said information about the implementation data is displayed in a different window from that in which said user input is entered.

18. In a data processor including a display system, a user input process which displays user input on the display system for designing an electronic circuit, and an implementation process which generates an implementation of the electronic circuit on a selected programmable logic device by performing a partition, place and route function, a method for providing design feedback to a user of the system, comprising:

accumulating user input representing incremental changes in the electronic design subject of the user input process, to produce a change message identifying one or more incremental change;

forwarding the change message to the implementation process;

producing implementation data in response to the change message;

analyzing the implementation data to produce a feedback message; and displaying the feedback message on the display as feedback to the user, while user input of the user input process is being displayed;

wherein the feedback message includes information indicating a particular plurality of programmable logic devices is suitable for the electronic circuit being designed and information indicating a performance characteristic of the generated implementation, the feedback message indicating either of the selected programmable logic device and the performance characteristic to be changed by the user.

19. The method of claim 18, wherein said feedback message is displayed in a different window from that in which said user input is entered.

20. The method of claim 18, wherein said feedback message is displayed in the same window as user input is entered.

21. The method of claim 18, wherein said implementation data comprises a design alternative.

22. The method of claim 18, wherein the user input process includes a graphical user interface in which a graphic representation of the change in design of the electronic circuit is displayed, and the step of displaying includes displaying the feedback message while the graphic representation of the change in design is being displayed.

23. The method of claim 18, wherein the user input process includes a text input interface in which a description language representation of the change in design of the electronic circuit is displayed, and the step of displaying includes displaying the feedback message while the description language representation of the change in design is being displayed.

24. The method of claim 18, wherein the user input process generates a list of logical elements in the electronic design, and the change message includes changes in the list of logical elements.

25. The method of claim 18, wherein the step of accumulating includes analyzing the user input to identify sets of one or more incremental changes meeting a metric for change messages.

26. The method of claim 18, wherein the performance characteristic comprises the speed of operation of the generated implementation.

27. The method of claim 18, wherein the performance characteristic comprises the size of the generated implementation.

28. The method of claim 18, wherein the performance characteristic comprises the power consumption of the generated implementation.

29. The method of claim 18, including displaying icons representing respective target devices on the display, and responding to selection of a particular icon by providing feedback about the respective target device.

30. The method of claim 18, wherein the step of producing implementation data includes retrieving data concerning implementation of the change from a database.

31. The method of claim 18, wherein the data processing system includes a first processor executing the user input process, a second processor executing the implementation process, and a backbone communication link between the first and second processors, and wherein the step of forwarding includes transmitting the information about the change from the first processor to the second processor across the backbone communication link.

32. The method of claim 31, wherein the data processing system includes a third processor executing a second implementation process, and the method includes executing the implementation process on the second processor and the implementation process on the third processor concurrently.

* * * * *